(12) United States Patent
Baek et al.

(10) Patent No.: US 8,441,005 B2
(45) Date of Patent: May 14, 2013

(54) LIGHT-EMITTING MATERIAL COMPRISING PHOTOACTIVE GROUP-BONDED POLYSILSESQUIOXANE HAVING A LADDER STRUCTURE, THIN FILM USING THE SAME AND ORGANIC ELECTRONIC DEVICE COMPRISING THE SAME

(75) Inventors: Kyung Youl Baek, Seoul (KR); Seung Sang Hwang, Seoul (KR); Seung-Sock Choi, Gumi-si (KR); Albert S. Lee, Seoul (KR); He Seung Lee, Seoul (KR); SungYoun Oh, Seoul (KR)

(73) Assignee: Korea Institute of Science and Technology (KR)

( * ) Notice: Subject to any disclaimer, the term of this patent is extended or adjusted under 35 U.S.C. 154(b) by 319 days.

(21) Appl. No.: 12/881,718

(22) Filed: Sep. 14, 2010

(65) Prior Publication Data
US 2011/0260139 A1    Oct. 27, 2011

(30) Foreign Application Priority Data
Apr. 26, 2010    (KR) .................. 10-2010-0038276

(51) Int. Cl.
*H01L 35/24*    (2006.01)

(52) U.S. Cl.
USPC ..................................... 257/40; 257/E51.001

(58) Field of Classification Search .................... 257/40, 257/E51.001
See application file for complete search history.

(56) References Cited

FOREIGN PATENT DOCUMENTS
JP    2005100710 A    *    4/2005

OTHER PUBLICATIONS
Machine Translation of JP 2005-100710.*

* cited by examiner

*Primary Examiner* — Anthony Ho
(74) *Attorney, Agent, or Firm* — Cantor Colburn LLP (57) ABSTRACT

Disclosed is a light-emitting material including a polysilsesquioxane having a ladder structure with photoactive groups bonded to a siloxane backbone. In addition to superior heat resistance and mechanical property, the light-emitting material provides improved cotability and film property when prepared into a thin film. Further, it provides higher luminous efficiency than the existing organic-based light-emitting material.

12 Claims, 10 Drawing Sheets

LIGHT-EMITTING MATERIAL COMPRISING PHOTOACTIVE GROUP-BONDED POLYSILSESQUIOXANE HAVING A LADDER STRUCTURE, THIN FILM USING THE SAME AND ORGANIC ELECTRONIC DEVICE COMPRISING THE SAME

CROSS-REFERENCE TO RELATED APPLICATION

This application claims priority to Korean Patent Application No. 10-2010-0038276, filed on Apr. 26, 2010, and all the benefits accruing therefrom under 35 U.S.C. §119, the contents of which in its entirety are herein incorporated by reference.

BACKGROUND

1. Field

This disclosure relates to a light-emitting material including a polysilsesquioxane having a ladder structure, specifically a polysilsesquioxane having a ladder structure with photoactive groups bonded at the siloxane backbone, a thin film prepared therefrom, and an organic electronic device including the same.

2. Description of the Related Art

In general, a hybrid material consisting of organic and inorganic components may exhibit significantly improved thermal, mechanical and chemical properties over the two components. Particularly, polysilsesquioxane (PSQ) with the empirical formula $(RSiO_{1.5})_n$ allows introduction of various functional groups via a relatively easy method and, due to superior cotability, is used as a thin film material in various fields.

In addition, the functional groups covalently bonded to the siloxane structure often show superior performance which is hardly found in organic based polymers. For example, a polyhedral oligomeric silsesquioxane (POSS) of the following formula having photoactive groups exhibits a significantly improved photoluminescence efficiency over similar organic based polymers.

These are related with the aggregation of functional groups in existing organic polymers. Since most of organic polymers have their functional groups bonded to short, flexible carbon chains, the functional groups tend to aggregate and do not exert desired luminescence efficiencies.

In contrast, since the siloxane bonding provides a rigid backbone, it prevents the functional groups attached to the side chains from aggregating and allows the functional groups to move freely as if in liquid phase. For these reasons, development in organic-inorganic hybridization has been made a lot with respect to the POSS having stable and continuous siloxane bondings.

However, despite the various interesting phenomena of POSS, it does not make a practical material for use as a thin film in electronic devices such as organic light-emitting diodes (OLED) or organic photovoltaic cells because of low molecular weight, which results in relatively low glass transition temperature and melting point.

SUMMARY

This disclosure is directed to providing a light-emitting material having superior thermal and mechanical properties as well as superior thin film formation properties through a light-emitting material comprising a polysilsesquioxane having a ladder structure allowing photoactive groups to be sufficiently separated, in order to overcome the poor heat resistance and low luminous efficiency of the existing organic-based light-emitting material and the poor thin film formation property of the existing POSS.

In one aspect, there is provided a light-emitting material comprising a polysilsesquioxane having a ladder structure with photoactive groups bonded to a siloxane backbone.

In another aspect, there is provided a thin film prepared by coating the light-emitting material on a substrate In another aspect, there is provided an organic electronic device comprising an anode, a cathode and the thin film provided between the anode and the cathode.

The disclosed light-emitting material has better luminous efficiency as compared to existing organic-based light-emitting materials and improved cotability and film property when prepared into thin film, as well as superior heat resistance and mechanical property.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

This disclosure relates to a light-emitting material comprising a polysilsesquioxane having a ladder structure with photoactive groups bonded to a siloxane backbone, which has high luminous efficiency as well as superior heat resistance and mechanical property.

It is because the polysilsesquioxane having a ladder structure has a rigid polymer structure, which allows a relatively longer distance between the photoactive groups attached to the silicon atoms, thereby allowing free movement and easy separation from the siloxane backbone. The rigid polymer structure and the long distance between the photoactive groups prevent the formation of an excimer resulting from π-π interaction.

In one embodiment, the polysilsesquioxane may be represented by Chemical Formula 1:

(1)

In the above formula, R is a substituted or unsubstituted phenylene-based, pyrene-based, rubrene-based, coumarin-based, oxazine-based, carbazole-based, thiophene-based, iridium-based, porphyrin-based, azo-based dye group bonded phenyl-based ring, a heterocyclic ring thereof, a photoactive functional group having a double or triple bond in a ring, and a derivative thereof; and n is from 1 to 100,000.

In one embodiment, the heterocyclic ring may contain a non-carbon atom such as nitrogen, oxygen or sulfur, and may be a saturated or unsaturated heterocyclic ring.

In one embodiment, in Chemical Formula 1, R may be N-alkyl-substituted carbazole. The alkyl group of R may be $C_1$-$C_{12}$ alkyl. It may be any alkyl group having said number of carbon atoms.

In this regard, the inventors have confirmed that the rigid-structure polysilsesquioxane represented by Chemical Formula 2 wherein R is propylcarbazole has superior thermal stability. For instance, it is thermally stable even at a temperature as high as 400 to 500° C., and may have a glass transition temperature about 100° C. higher than the existing polyhedral oligomeric silsesquioxane (POSS).

(2)

In the above formula, n is from 1 to 100,000.

The inventors have also confirmed that a thin film prepared from a silicon-based polysilsesquioxane having carbazole groups exhibits much superior luminous efficiency as compared to a thin film prepared from a hydrocarbon-based polyvinylcarbazole. It is because the rigid polymer structure and the long distance between the photoactive groups prevent the formation of an excimer resulting from π-π interaction.

The distance between the photoactive groups attached to the polysilsesquioxane having a ladder structure may be 13 to 16 Å, and the average thickness of the siloxane backbone may be 4 to 5 Å.

This disclosure also relates to a thin film prepared by coating the light-emitting material on a substrate.

The thin film prepared by coating the light-emitting material has improved thin film properties because of superior cotability and film property unlike the existing POSS.

Whereas the existing POSS is associated with the problems of flowing without forming a film or scattering like powder after the evaporation of solvent, when forming a thin film, the thin film prepared from the light-emitting material according to this disclosure with photoactive groups bonded to the polysilsesquioxane with a rigid and long backbone has improved thin film property because of superior cotability and film property. Further, a transparent thin film may be obtained because the polysilsesquioxane backbone comprises silicon.

The thin film may have a surface roughness $R_a$ of 0.5 nm or smaller. According to the measurement result by the inventors, the surface roughness was 0.5 nm or smaller, specifically 0.3 nm or smaller. Such a small surface roughness is hardly observed in a thin film prepared from a silsesquioxane having a crystalline cage structure such as POSS.

The thickness of the thin film may be determined adequately depending on the electronic device to be prepared. Although not particularly limited, it may be 50 to 500 nm, specifically 50 to 300 nm.

The thin film may be coated on a substrate according to a commonly used coating method without particular limitation. For example, one or more selected from a group consisting of physical vapor deposition, chemical vapor deposition, sputtering, spray coating, spin coating, doctor blading and screen printing may be employed. Specifically, spin coating may be selected.

This disclosure also relates to an organic electronic device comprising a plurality of electrodes and the thin film according to the disclosure provided between the electrodes.

The organic electronic device is not specially limited, and may be, for example, an organic light-emitting diode or a photovoltaic cell. If the organic electronic device is an organic light-emitting diode, it may have a configuration of a first electrode, one or more organic layer(s) including a light-emitting layer, and a second electrode stacked in sequence. If the organic electronic device is a photovoltaic cell, it may have a configuration of a lower electrode, an organic layer including a light-emitting layer formed on the lower electrode, and an upper electrode formed on the organic layer.

Although common organic polymers are inapplicable to a photovoltaic cell because of poor thermal stability and endurance, the light-emitting material according to the disclosure with photoactive groups bonded to a polysilsesquioxane having a ladder structure is adequate for a photovoltaic cell because it has good thermal and mechanical stability as well as superior light-emitting property.

EXAMPLES

The examples and experiments will now be described. The following examples and experiments are for illustrative purposes only and not intended to limit the scope of this disclosure.

Example 1

First, 3-bromopropyltrimethoxysilane (BPTMS) and carbazole were reacted in dimethylformamide (DMF) at 130° C. for 48 hours in the presence of $K_2CO_3$ to synthesize a 9-[3-(trimethoxysilyl)propyl]-9H-carbazole monomer. The monomer and $K_2CO_3$ were subjected to the next step without purification, except for removing the solvent and excess BPTMS using a vacuum evaporator. The monomer was dissolved again in DMF and then hydrolyzed at room temperature by adding 10 times the volume of water by single drip irrigation. As the monomer was hydrolyzed, the hydrolyzed monomer was simultaneously polymerized by condensation. One hour later, poly(propylcarbazole silsesquioxane) (PPCSQ) was obtained as yellow precipitate in solution.

Experimental Example 1

Weight average molecular weight and molecular weight distribution of the PPCSQ prepared in Example 1 were measured using a JASCO PU-2080 Plus SEC system equipped with an RI-2031 Plus refractive index detector and a UV-2075 Plus UV detector (detection wavelength: 254 nm). Measurement was made in THF at 40° C. at a flow rate of 1 mL/min. Sample was separated using four columns (Shodex GPC KF-802, KF-803, KF-804 and KF-805). SEC analysis revealed that the PPCSQ had a weight average molecular weight of 10,200 and a molecular weight distribution of 2.16.

Experimental Example 2

Figure 1:
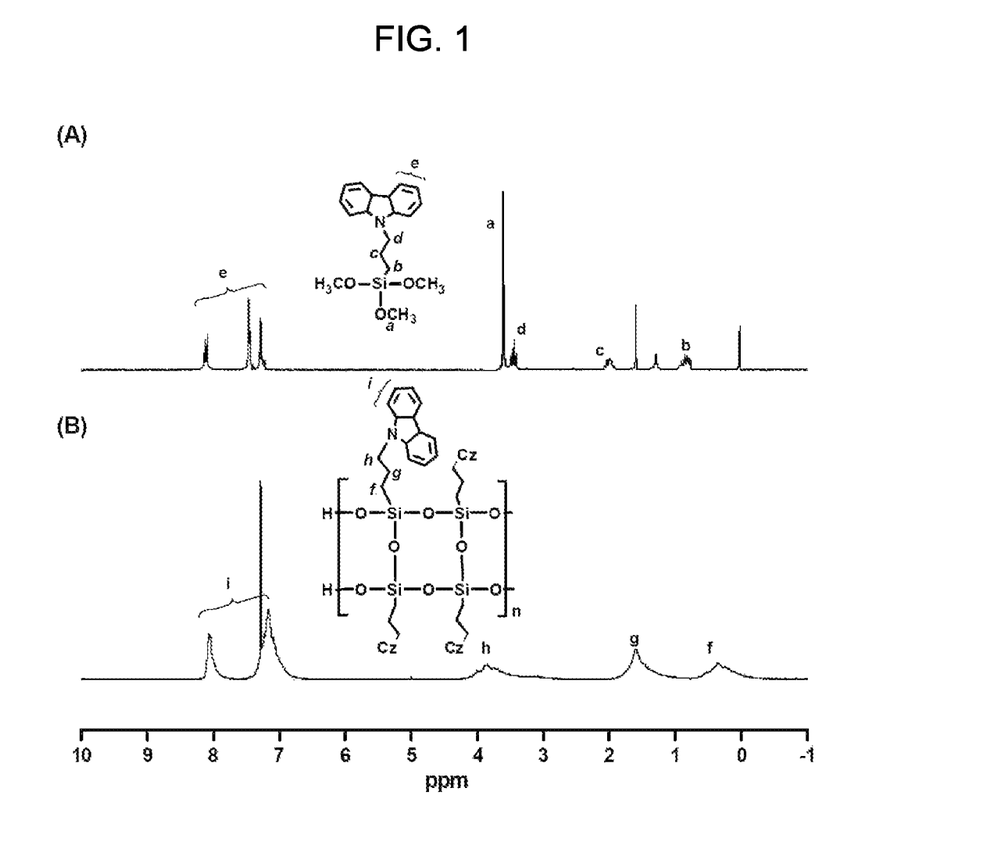
FIG. 1 shows a $^1$H spectrum of a polysilsesquioxane prepared according to an embodiment.
Figure 2:
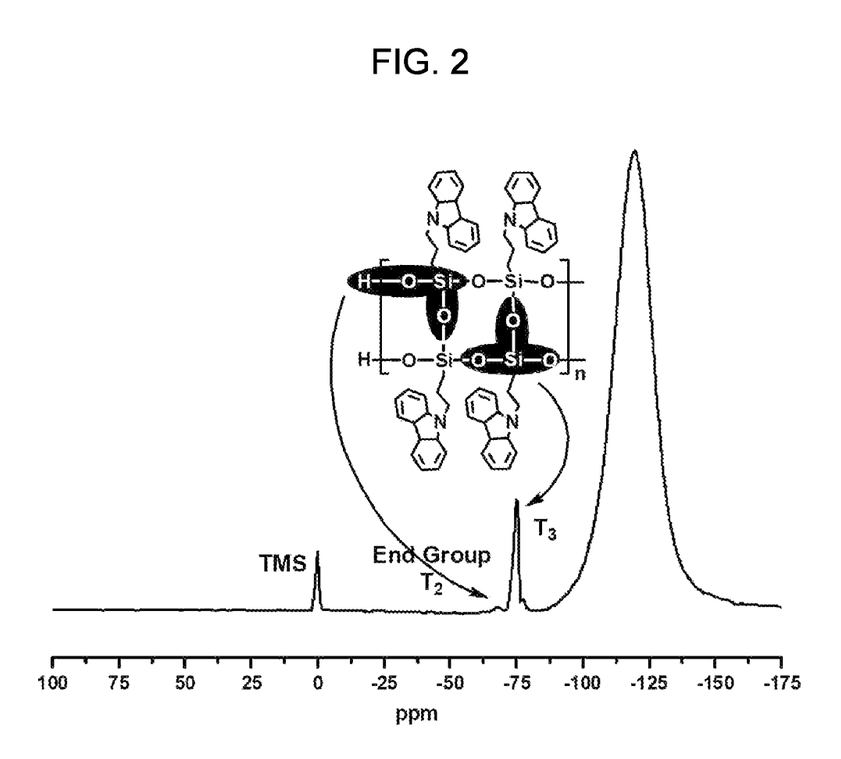
FIG. 2 shows a $^{29}$Si $^1$H spectrum of a polysilsesquioxane prepared according to an embodiment.

$^1H$ and $^{29}Si$ spectra of the PPCSQ prepared in Example 1 were recorded in $CDCl_3$ at 25° C. using Varian Unity Inova ($^1H$: 300 MHz, $^{29}Si$: 99.5 MHz). FIG. 1 and FIG. 2 respectively show the $^1H$ spectrum and the $^{29}Si$ spectrum.

In FIG. 1, (A) and (B) respectively show $^1H$ spectra of the 9-[3-(trimethoxysilyl)propyl]-9H-carbazole monomer and the PPCSQ. The disappearance of the trimethoxy peak a and the broadened peaks f through i in (B) show that the completely hydrolyzed monomer was successfully condensation polymerized to yield the PPCSQ.

FIG. 2 shows the $^{29}Si$ NMR spectrum of the PPCSQ. The broad and large absorption peak at −70.6 to −79.2 ppm and the small downfield absorption peak respectively represent the $T_3$ structure of the siloxane bond [R—Si(OSi—)$_3$] and the $T_2$ structure of the siloxane bond [R—Si(OSi—)$_2$(OR')]. With the increase of the $T_3$ structure, the defect of the siloxane bonding decreases. $T_3$:$T_2$ was calculated as 98% from the integration of the peaks. This result reveals that the majority of the hydroxyl groups of the hydrolyzed monomer participated in the condensation polymerization to give the PPCSQ having a ladder structure, and only a trace amount of hydroxyl groups remains at the end of the PPCSQ chain.

Experimental Example 3

A Fourier transform infrared (FT-IR) spectrum of the PPCSQ prepared in Example 1 was measured using a Perkin-Elmer FT-IR system (Spectrum GX), using a film solvent-cast on KBr pellets. The result is shown in FIG. 3.

Figure 3:
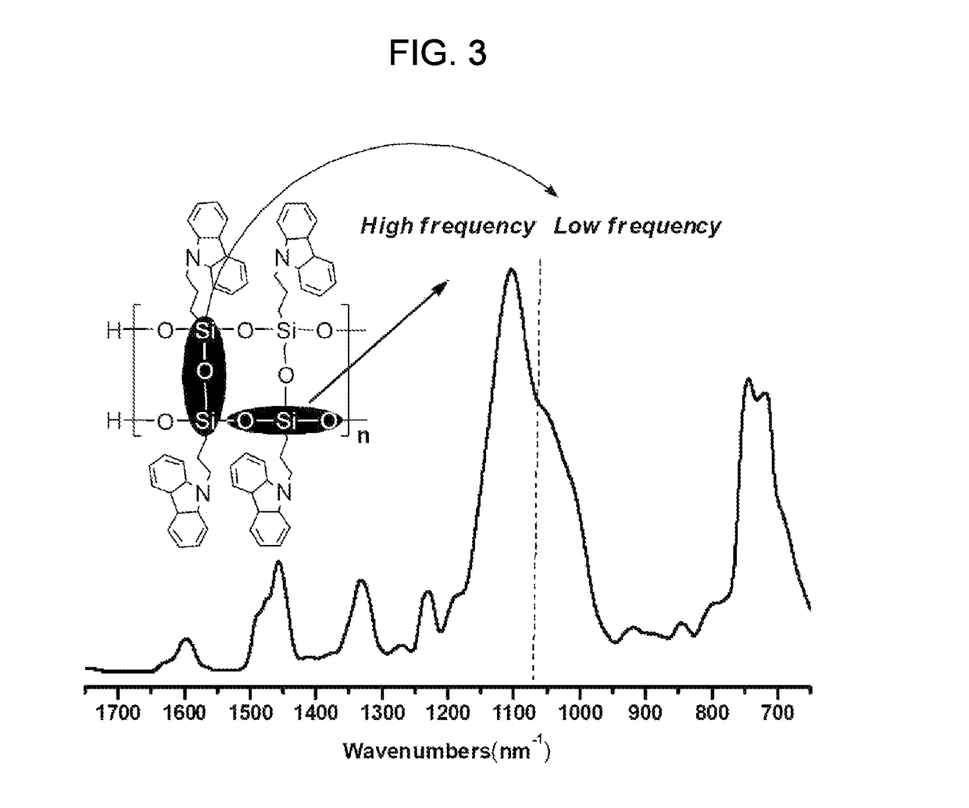
FIG. 3 shows an FT-IR analysis result of a polysilsesquioxane prepared according to an embodiment.

Referring to FIG. 3, the FT-IR analysis result also reveals that the PPCSQ prepared in Example 1 has a controlled ladder structure. A broad bimodal absorption peak was observed at 960 to 1200 cm$^{-1}$, which is due to the stretching vibration of the siloxane bonding of the PPCSQ in vertical (—Si—O—Si—R) and horizontal (—Si—O—Si—) directions. The well-defined peak close to 1200 cm$^{-1}$ due to the horizontal siloxane bonding reveals that the PPCSQ has a more ladder-like structure.

Experimental Example 4

X-ray diffraction (XRD) analysis was performed to more precisely define the structure of the PPCSQ prepared in Example 1. The result is shown in FIG. 4.

Figure 4:
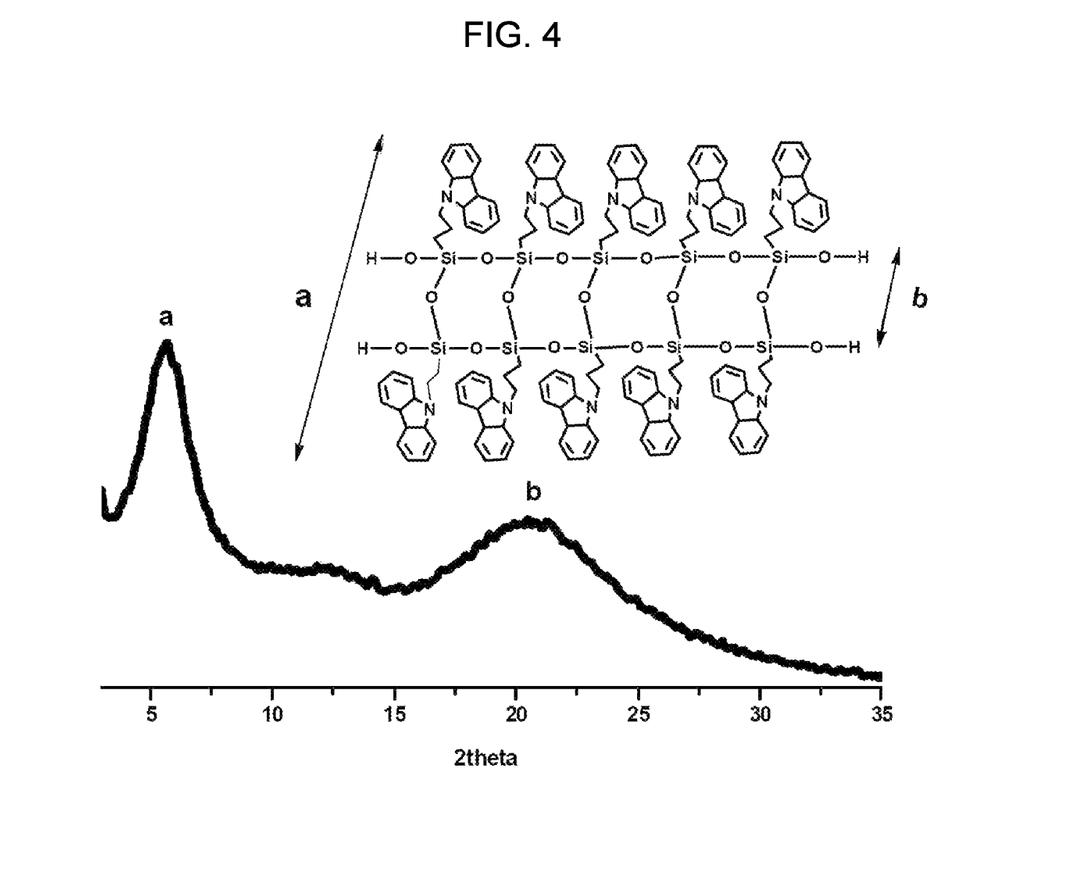
FIG. 4 shows an X-ray diffraction (XRD) analysis result of a polysilsesquioxane prepared according to an embodiment.

Referring to FIG. 4, two characteristic diffraction peaks were observed at 5.66° (a) and 20.6° (b). The sharp peak (a) represents the periodical chain-chain distance ($d_1$=15.6 Å), i.e. the distance between two carbazole groups of the PPCSQ having the ladder-shaped siloxane backbone, whereas the diffuse peak (b) represents the average thickness of the siloxane backbone ($d_2$=4.3 Å).

Experimental Example 5

The thermal behavior of the PPCSQ prepared in Example 1 was monitored using a thermal gravimetric analyzer (TGA) and a differential scanning calorimeter (DSC). The result is shown in FIG. 5 and FIG. 6.

Figure 5:
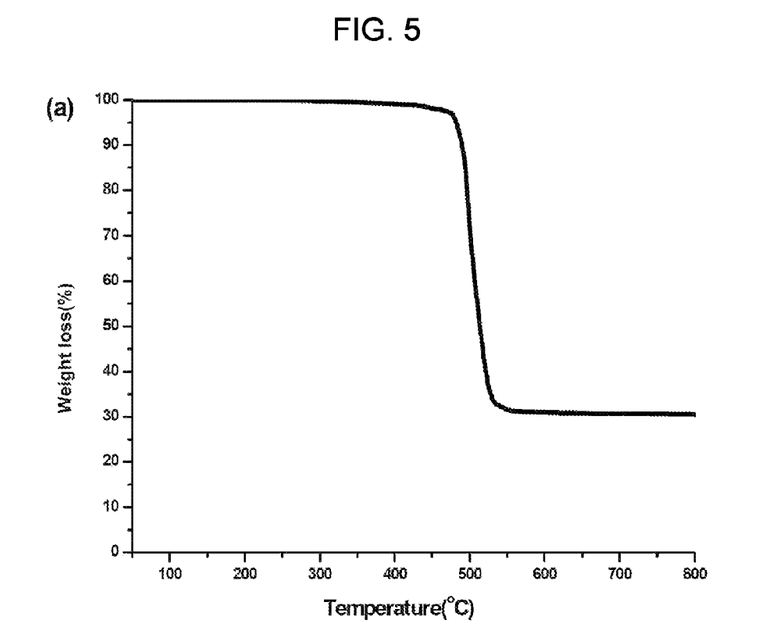
FIG. 5 shows a thermal behavior of a polysilsesquioxane prepared according to an embodiment measured using a thermal gravimetric analyzer (TGA)

FIG. 5 shows the monitoring result using a TGA, from 25° C. to 1000° C. at a scan rate of 10° C./min under nitrogen atmosphere. The slight weight loss (~5%) from 300 to 450° C.

is thought to be due to the decomposition of hydroxyl groups at the end of the PPCSQ chain. Thereafter, the weight was lost by ~60% until 580° C. due to the decomposition of the propylcarbazole group. The remaining weight 35% was stable until 1000° C., which may be that of the remaining silica compound. This suggest that the PPCSQ is thermally more stable than the existing hydrocarbon-based poly(vinylcarbazole) (PVK), which is completely decomposed at 420 to 550° C.

Figure 6:
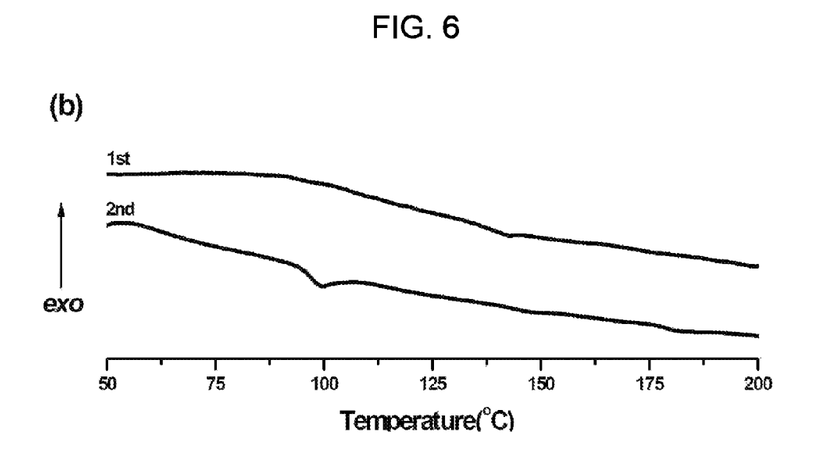
FIG. 6 shows a thermal behavior of a polysilsesquioxane prepared according to an embodiment measured using a differential scanning calorimeter (DSC)

FIG. 6 shows the monitoring result using a DSC, from 25° C. to 1000° C. at a scan rate of 10° C./min under nitrogen atmosphere. The DSC curve shows a single glass transition temperature at 95° C. during the second heating. This relatively low transition temperature confirms that the PPCSQ having the ladder structure is distinguished from POSS.

Experimental Example 6

The PPCSQ prepared in Example 1 was spin coated on a silicon wafer using a monochlorobenzene solution (0.5 wt %) and then dried at 40° C. in vacuum for 5 hours. Surface property of thus prepared thin film sample was observed by atomic force microscopy (AFM). The result is shown in FIG. 7.

Figure 7:
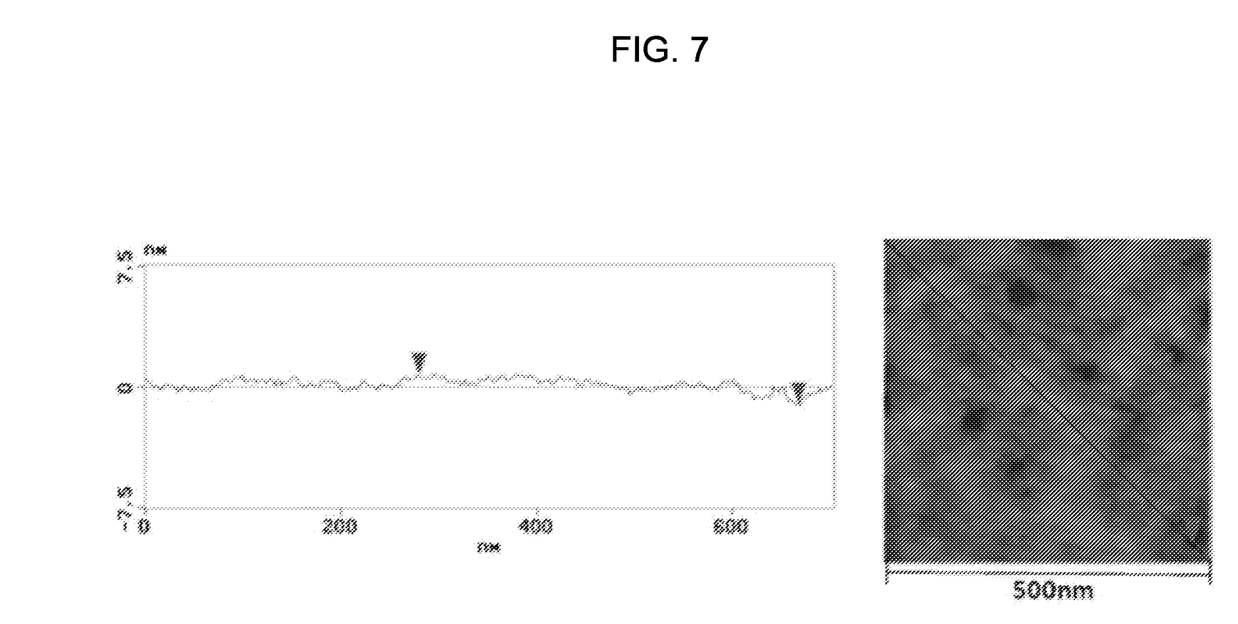
FIG. 7 shows a surface property of a thin film comprising a light-emitting material according to an embodiment observed by atomic force microscopy (AFM)

As seen from FIG. 7, the PPCSQ film had a surface roughness $R_a$ of 0.216 nm. Such a small surface roughness is hardly observed in a thin film prepared from a silsesquioxane having a crystalline cage structure such as POSS.

Experimental Example 7

In order to test the electro-optical properties of the PPCSQ prepared in Example 1, the PPCSQ and the hydrocarbon-based PVK were added to THF ($1 \times 10^{-4}$ mol) to prepare solution samples. UV absorption and photoluminescence spectra were measured. The result is shown in FIG. 8.

Figure 9:
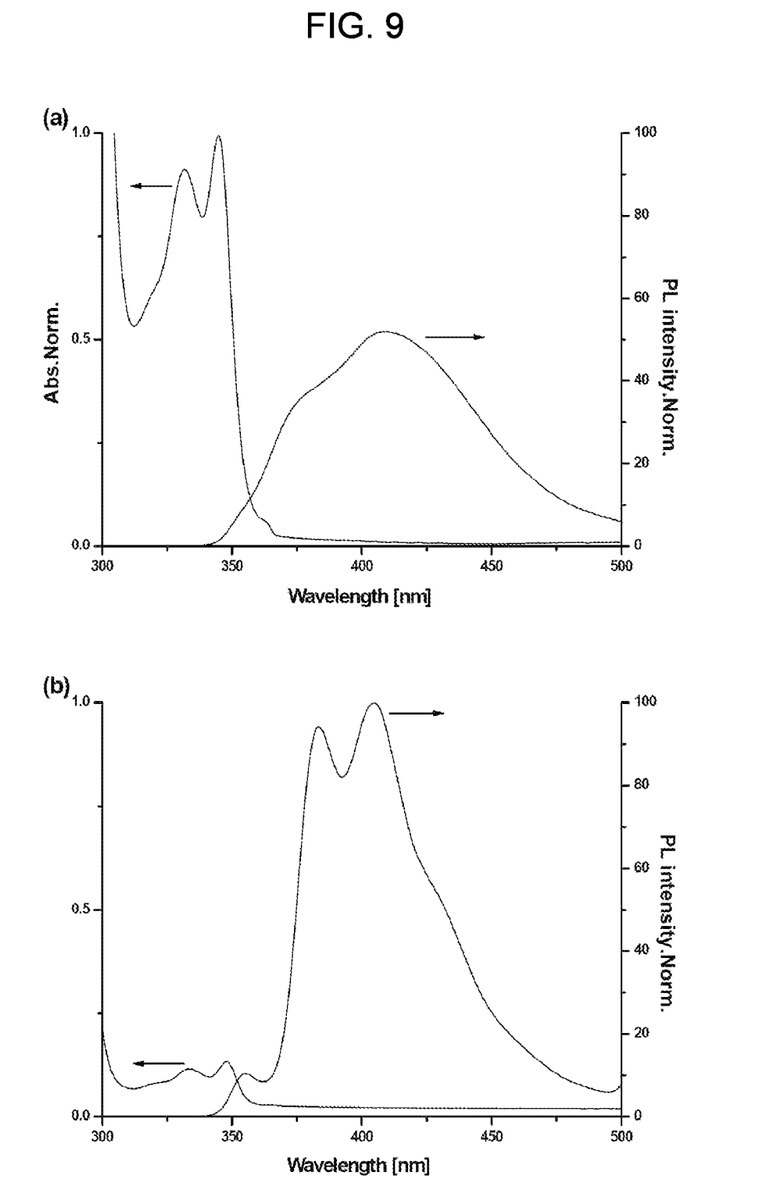
FIG. 9 shows UV absorption spectra and photoluminescence spectra of thin films comprising an existing organic-based light-emitting material (PVK: a) and a light-emitting material according to an embodiment (PPCSQ: b)

The PVK solution and the PPCSQ solution (1 wt % each) were spin coated on ITO glass and then dried in vacuum at 40° C. for 5 hours to prepare solid sample films. The film thickness was 200 nm. UV absorption and photoluminescence spectra of the PVK thin film and the PPCSQ thin film are shown in FIG. 9.

Figure 8:
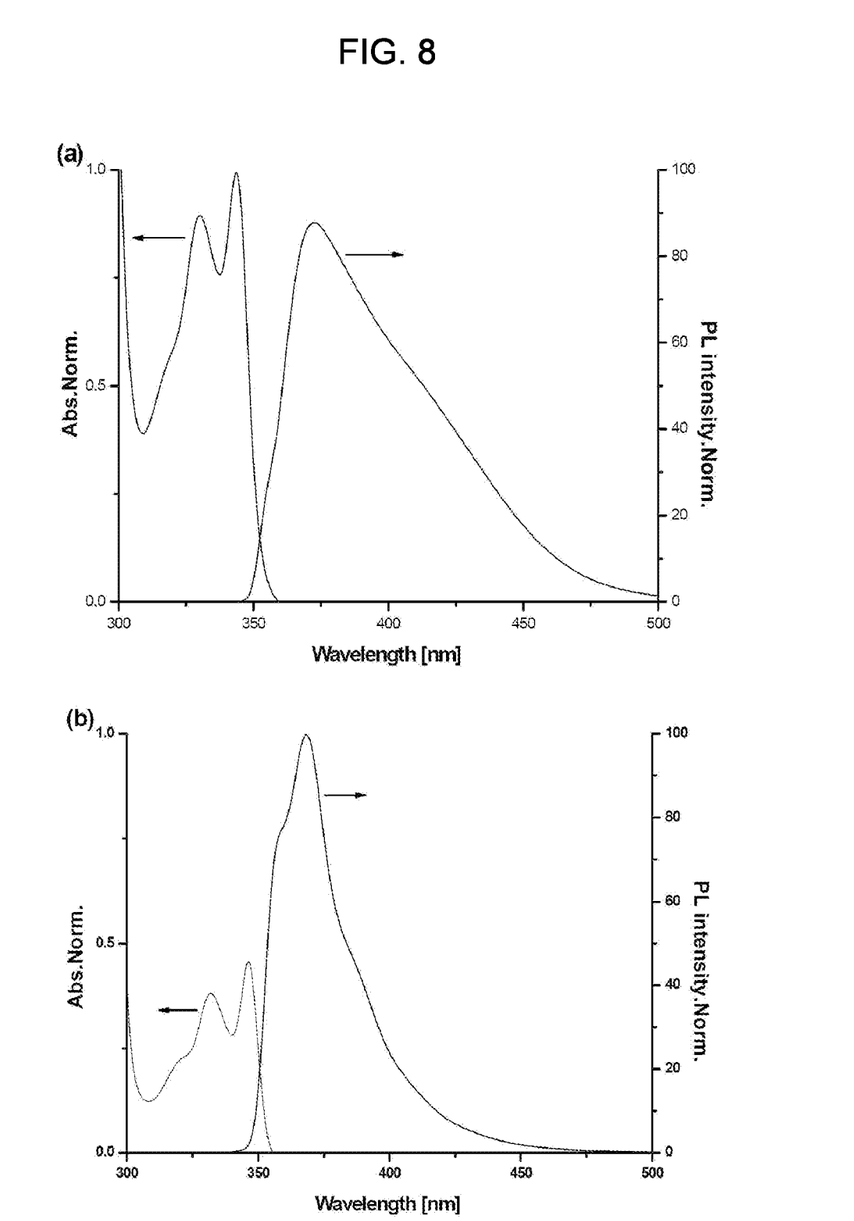
FIG. 8 shows UV absorption spectra and photoluminescence spectra of solution samples containing an existing organic-based light-emitting material (PVK: a) and a light-emitting material according to an embodiment (PPCSQ: b)

First, referring to FIG. 8, since the content of the carbazole group of the PPCSQ is about 50 mol % that of the PVK of similar weight percentage, the UV absorption peak of the PPCSQ was about half in intensity as compared to the corresponding PVK. However, the photoluminescence (PL) intensity was similar to that of the PVK and was narrower. This means that the carbazole group of the PPCSQ exhibits much higher quantum yield than that of the PVK. It is because the more rigid siloxane backbone of the PPCSQ allows easier separation of the carbazole group than the PVK having a more flexible hydrocarbon backbone, thereby preventing formation of excimers.

This phenomenon is more prominent in the solid film. Referring to FIG. 9, since the chain mobility is more restricted in solid phase, the carbazole group of the PVK is more aggregated than in solution. This explains why the PVK shows a broader PL spectrum with lower intensity in spite of more carbazole groups than the PPCSQ.

Example 2

Figure 10:
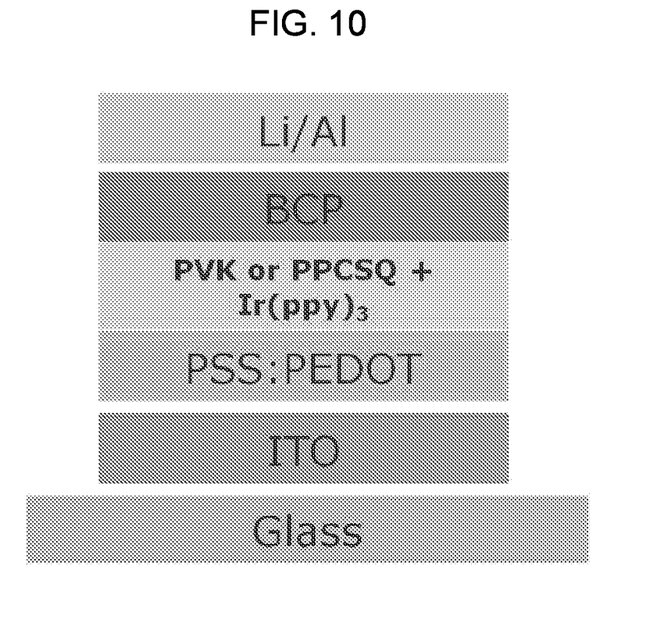
FIG. 10 shows a configuration of organic light-emitting diodes manufactured to compare the performance of an organic-based light-emitting material (PVK) and a light-emitting material according to an embodiment (PPCSQ)

Organic light-emitting diodes were manufactured as in FIG. 10 in order to compare light-emitting performance of the PPCSQ and the PVK. Indium tin oxide (ITO) glass was used as an anode and a hole injection layer of poly(3,4-ethylenedioxythiophene) (PEDOT) doped with polystyrene sulfonic acid (PSS) was formed thereon. Then, a light-emitting layer was formed thereon using the silicon-based PPCSQ prepared in Example 1 or a hydrocarbon-based polyvinylcarbazole (PVK), doped with tris(2-phenylpyridine)iridium (Ir(ppy)$_3$) at 92:8 based on weight. Then, after forming a 2,9-dimethyl-4,7-diphenyl-1,10-phenanthroline (BCP) layer as an electron injection layer and hole barrier layer, Li/Al alloy was vacuum-deposited as a cathode layer.

Experimental Example 8

Figure 11:
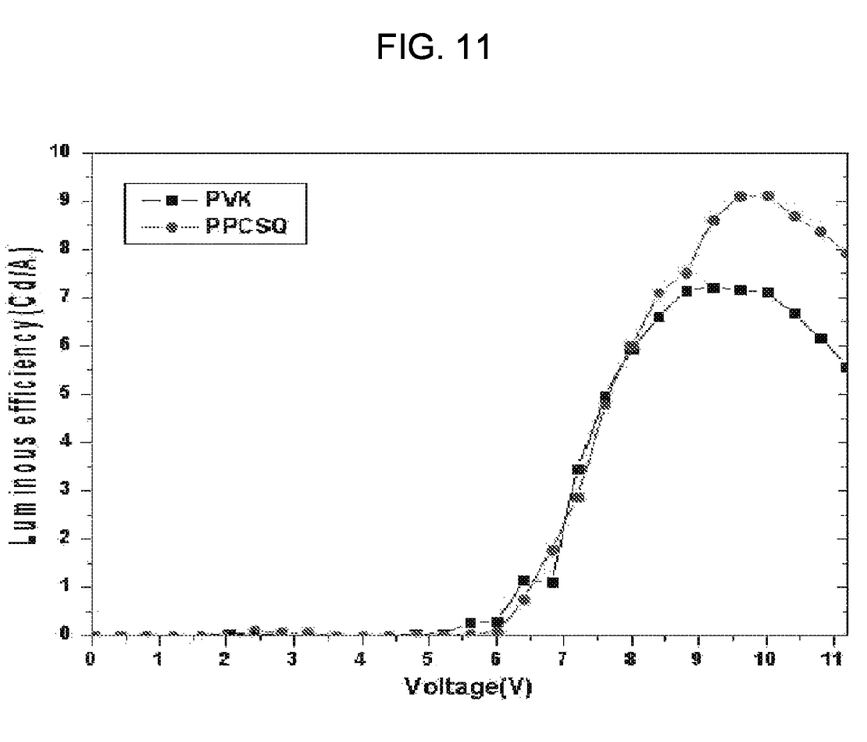
FIG. 11 compares luminous efficiency of the organic light-emitting diodes.

Luminous efficiency of the organic light-emitting diodes manufacture in Example 2 is shown in FIG. 11. Whereas the silicon-based PPCSQ prepared in Example 1 exhibited a luminous efficiency of 9.17 Cd/A at 11.6 V, that of the hydrocarbon-based PVK was 7.22 Cd/A at 9.2V. Even at 9.2 V, where the PVK showed the highest luminous efficiency, the PPCSQ exhibited higher luminous efficiency of 8.61 Cd/A. This result shows that, although the PPCSQ has less carbazole groups than the PVK for the same weight equivalence, it exhibits better luminous efficiency. As described earlier, such a superior light-emitting property is attained because the carbazole groups are more distant from each other than in the hydrocarbon backbone.

While the exemplary embodiments have been shown and described, it will be understood by those skilled in the art that various changes in form and details may be made thereto without departing from the spirit and scope of this disclosure as defined by the appended claims.

In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

What is claimed is:

1. A light-emitting material comprising a polysilsesquioxane having a ladder structure with photoactive groups bonded to a siloxane backbone
wherein the polysilsesquioxane is represented by Chemical Formula 1:

(1)

wherein R is a substituted or unsubstituted phenylene-based, pyrene-based, rubrene-based, coumarin-based, oxazine-based, carbazole-based, thiophene-based, iridium-based, porphyrin-based, azo-based dye group bonded phenyl-based ring, a heterocyclic ring thereof, a photoactive functional group having a double or triple bond in a ring, and a derivative thereof; and n is from 1 to 100,000.

2. The light-emitting material according to claim 1, wherein R is N-alkyl-substituted carbazole.

3. The light-emitting material according to claim 1, wherein polysilsesquioxane is represented by Chemical Formula 2:

(2)

wherein n is the same as defined in Chemical Formula 1.

4. A thin film prepared by coating the light-emitting material according to claim 1 on a substrate.

5. The thin film according to claim 4, which has a surface roughness Ra of 0.5 nm or smaller.

6. The thin film according to claim 4, which has a thickness of 50 to 500 nm.

7. The thin film according to claim 4, wherein the light-emitting material is coated on the substrate by spin coating.

8. An organic electronic device comprising a plurality of electrodes and the thin film according to claim 4 provided between the electrodes.

9. The organic electronic device according to claim 8, which is an organic light-emitting diode.

10. The organic electronic device according to claim 8, which is a photovoltaic cell.

11. A thin film prepared by coating the light-emitting material according to claim 2 on a substrate.

12. A thin film prepared by coating the light-emitting material according to claim 3 on a substrate.

* * * * *